US006657262B2

United States Patent
Patti

(10) Patent No.: US 6,657,262 B2
(45) Date of Patent: Dec. 2, 2003

(54) MONOLITHICALLY INTEGRATED ELECTRONIC DEVICE AND FABRICATION PROCESS THEREFOR

(75) Inventor: Davide Patti, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 83 days.

(21) Appl. No.: 09/823,915

(22) Filed: Mar. 30, 2001

(65) Prior Publication Data

US 2001/0050412 A1 Dec. 13, 2001

(30) Foreign Application Priority Data

Mar. 31, 2000  (IT) .......................... MI00A0688

(51) Int. Cl.[7] .................. H01L 29/76; H01L 29/94; H01L 31/002; H01L 31/113; H01L 31/119; H01L 29/00; H01L 27/082; H01L 27/102; H01L 21/8238

(52) U.S. Cl. .............. 257/370; 257/378; 257/511; 257/592; 257/593; 438/201; 438/202; 438/207; 438/226; 438/234

(58) Field of Search .................. 257/370, 378, 257/341, 401, 396, 511, 592, 593, 519; 438/201, 202, 207, 226, 234

(56) References Cited

U.S. PATENT DOCUMENTS

| 4,689,656 | A | * | 8/1987 | Silvestri et al. ............. 257/513 |
| 5,010,026 | A | * | 4/1991 | Gomi ................ 148/DIG. 157 |
| 5,557,139 | A | * | 9/1996 | Palara ........................ 257/592 |
| 5,665,994 | A | * | 9/1997 | Palara ........................ 257/378 |
| 6,316,818 | B1 | * | 11/2001 | Marty et al. ................ 257/378 |

* cited by examiner

Primary Examiner—Steven Loke
Assistant Examiner—Samuel Gebremariam
(74) Attorney, Agent, or Firm—Lisa K. Jorgenson; E. Russell Tarleton; SEED IP Law Group PLLC

(57) ABSTRACT

An electronic device, integrated monolithically in a semiconductor substrate and comprising a bipolar transistor connected in series to at least one MOS transistor, the bipolar transistor having a base region that includes a first buried region and a first diffused region extending continuously from the substrate surface down to the buried region, and the diffused region is bordered by an isolation trench region extending in the buried region.

13 Claims, 4 Drawing Sheets

MONOLITHICALLY INTEGRATED ELECTRONIC DEVICE AND FABRICATION PROCESS THEREFOR

TECHNICAL FIELD

This invention relates to a monolithically integrated electronic device, as well as to a process for fabricating the same.

Specifically, the invention relates to an electronic device that is integrated monolithically in a semiconductor substrate and includes a bipolar transistor connected in series to at least one MOS transistor, the bipolar transistor having a base region that includes a first buried region, and having a first diffused region which extends continuously from the substrate surface to the buried region.

The invention also relates to a process for fabricating an electronic device, integrated monolithically in a semiconductor substrate and having a bipolar transistor connected in series to at least one MOS transistor, the process including forming a bipolar transistor base region consisting of a first buried region and a surface diffused region extending from the surface to the buried region.

BACKGROUND OF THE INVENTION

As is well known, the expression "emitter-switching configured electronic device" is used to indicate a circuit arrangement wherein a low-voltage (BJT or MOS) transistor is connected in series to a high-voltage bipolar transistor such that the low-voltage transistor will cut off the emitter current flow of the high-voltage transistor, thereby causing the device to be turned off.

The above arrangement combines the advantages of both transistor types, and allows extension of the power device utility to applications that would be impracticable using either transistor type alone.

An example of the above prior structure called a "cascode" is shown in FIG. 1.

A first epitaxial layer 1' is grown on a substrate S' having a high concentration of an N-type dopant.

A first P-type buried region 2', and a second N-type buried region 3' overlying the first region 2', are formed in this layer 1' by ion implantation followed by a diffusion process.

These first and second regions are to form the deep base and emitter, respectively, of a high-voltage BJT transistor, designated B.

Thereafter, a second N-type epitaxial layer 4' is grown over the first epitaxial layer 1'.

Regions 6' of the P$^+$ type are formed preferably in the surface of the second epitaxial layer 4', as by ion implantation followed by a diffusing step.

These regions 6' are caused to join the P-type buried regions in the first epitaxial layer 1' in order to provide base surface contacts for transistor B.

Subsequently, regions 5' of the N$^+$ type are formed that will extend from the surface of the second epitaxial layer 4' down to the periphery of the emitter region 3'.

An isolation layer is then formed selectively to provide a gate oxide layer 7' for a pair of DMOSFET vertical transistors D.

By conventional deposition and photolithography techniques, a plurality of polycrystalline silicon regions 8' are formed to provide gate electrodes for the DMOSFETs D.

By conventional photolithography and ion implantation techniques, first P-type regions 9' and second N-type regions 10 are created in the monocrystalline silicon surface between the gate regions to respectively provide body and source regions for the DMOSFETs D.

By conventional photolithography and deposition techniques, electrical contacts 11' and the associated electrodes are formed in the front surface of the silicon wafer.

While advantageous on several counts, this prior solution has some drawbacks.

The flow of the base current of transistor B, from the base region 6' to the deep base region 2', meets with steadily increasing resistance in going from a higher concentration layer 6' to a lower concentration layer 2' before entering the emitter region 3'. This situation produces a decreasing difference of potential from region 3 to region 2. In particular, this difference will be greatest in the peripheral area of the emitter region 3' and least toward the middle of said region 3'.

The flow of the emitter/collector current will therefore concentrate in the peripheral area of the emitter region 3'.

This increased current flow causes the temperature to rise in that area, thereby enhancing the efficiency of the peripheral area of the emitter region and causing the current flow to increase further. Thus, a saturation effect is caused to occur, with a positive loop which deteriorates the overall structure performance.

The technical problem underlying this invention is to provide a cascode circuit structure, having a bipolar transistor and a MOS transistor, with structural and functional features appropriate to afford better control of the bipolar transistor current flow and overcome the limitations of prior circuit structures.

SUMMARY OF THE INVENTION

The disclosed embodiment of the present invention provides an electronic device having a bipolar transistor and a MOS transistor, wherein the base surface region of the bipolar transistor is surrounded by an isolation structure directed to isolate it from the associated emitter region.

In accordance with one embodiment of the invention, an electronic device is provided that includes a bipolar transistor connected in series to at least one MOS transistor integrated monolithically in a semiconductor substrate, the bipolar transistor having a base region that includes a first buried region and a first diffused region extending continuously from the substrate surface to the buried region, the diffused region formed to be partially enclosed in an isolation trench region extending in the buried region.

In accordance with another embodiment of the invention, a monolithically integrated power device is disclosed, including a MOSFET transistor and a bipolar power transistor coupled together to form a cascode-type cell, the bipolar power transistor having a first buried region of a first type and a second buried region of a second type formed over the first buried region in a first epitaxial layer, a second epitaxial layer formed over the first epitaxial layer, a plurality of isolation trenches formed in the second epitaxial layer to extend from the surface of the second epitaxial layer through the second buried region and into the first buried region; and a plurality of diffused regions formed to be partially enclosed by the respective isolation trench and to contact the first buried region.

In accordance with yet another embodiment of the invention, a process for fabricating an electronic device is provided, including forming a bipolar transistor connected in series to at least one MOS transistor integrated monolithically in a semiconductor substrate, the process of forming including forming a base region of the bipolar transistor having a first buried region and a surface diffused region extending from the surface down to the buried region, and forming an isolation trench region extending down to and enclosing the diffused region filled in the buried region.

The features and advantages of a device according to the invention will be apparent from the following description of an embodiment thereof, given by way of non-limitative example with reference to the accompanying drawings.

DETAILED DESCRIPTION OF THE INVENTION

Figure 1:
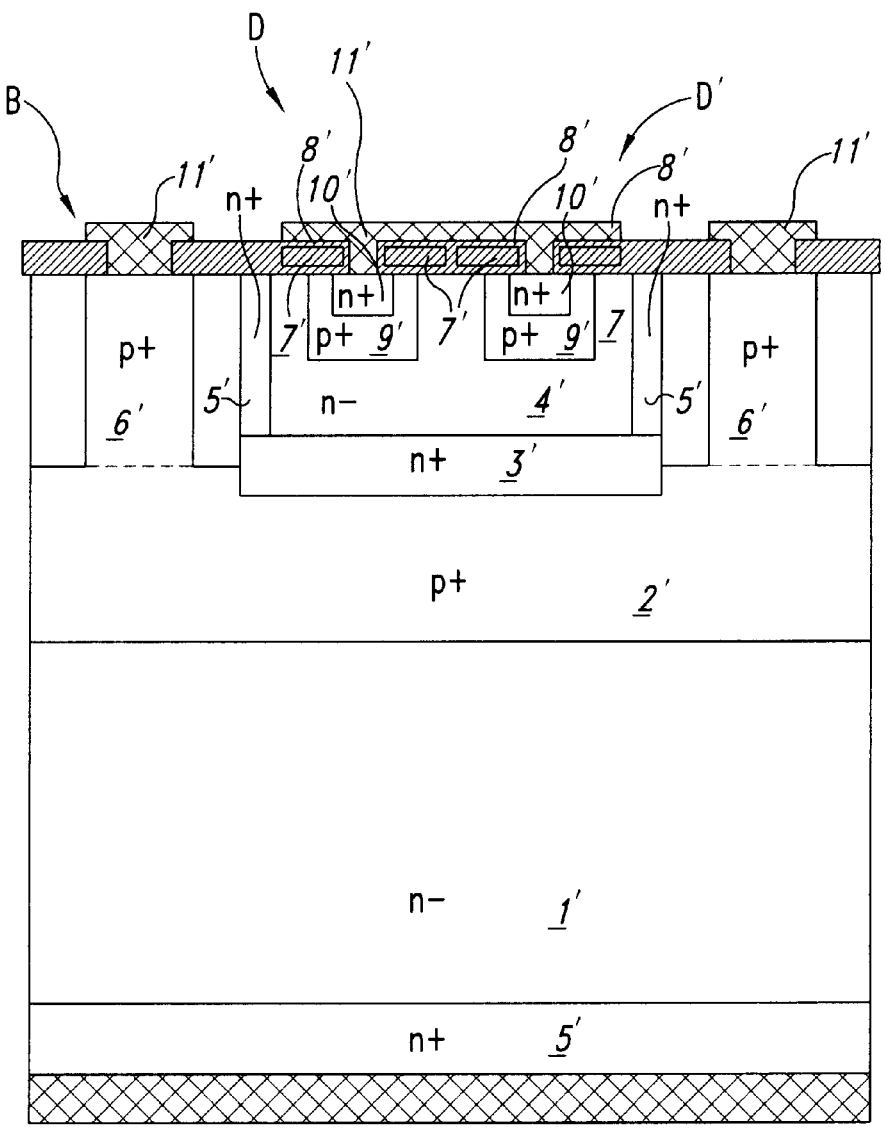
FIG. 1 is a vertical cross-section view, drawn to an enlarged scale, of a cascode configuration integrated device of the MOS-bipolar type according to the prior art.
Figure 2:
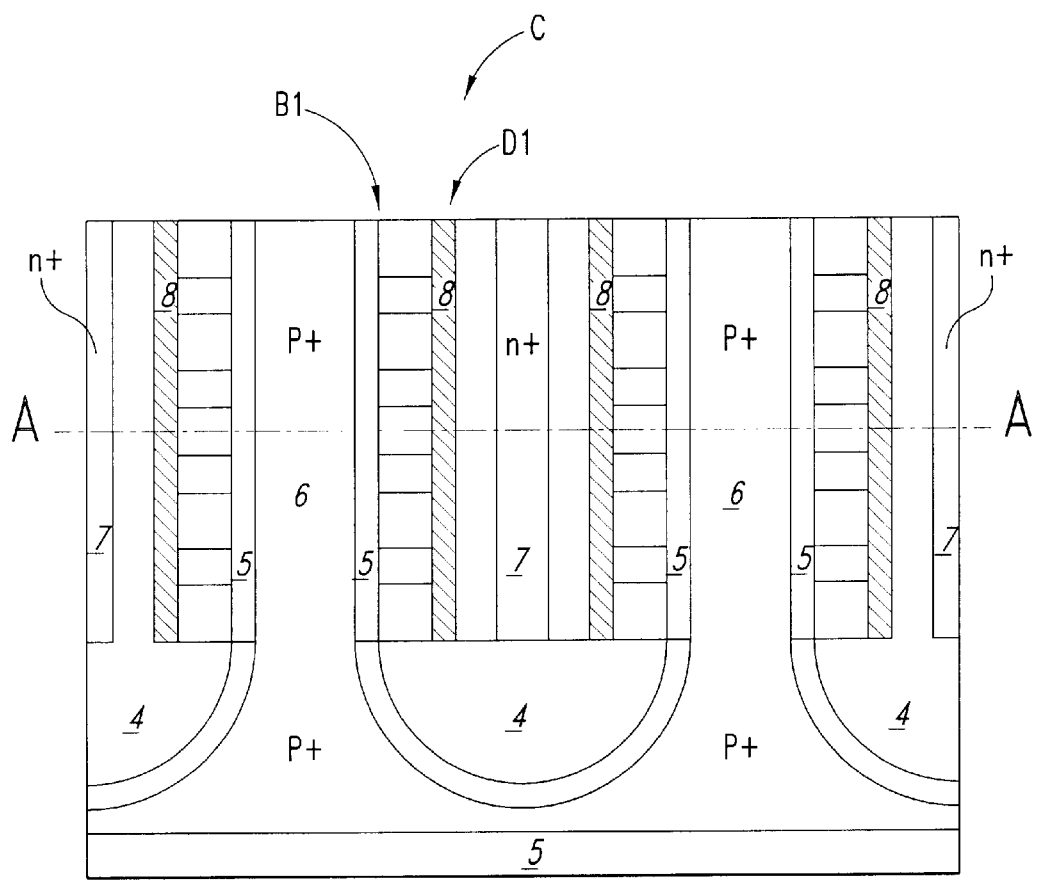
FIG. 2 is a top plan view of an emitter switching configuration integrated device of the MOS-bipolar type, according to an embodiment of the invention.

A monolithically integrated power device, and a process for fabricating it, will now be described with reference to FIGS. 2–4.

The power device specifically comprises an N-channel MOSFET transistor, designated D1, and an NPN bipolar power transistor, designated B1.

In a preferred embodiment, transistor D1 is a DMOS double-diffused transistor, and transistor B1 is an NPN vertical transistor.

The transistor pair B1, D1 form a cascode-type cell, and cells C are formed into mirror-image pairs in a semiconductor substrate.

Figure 3:
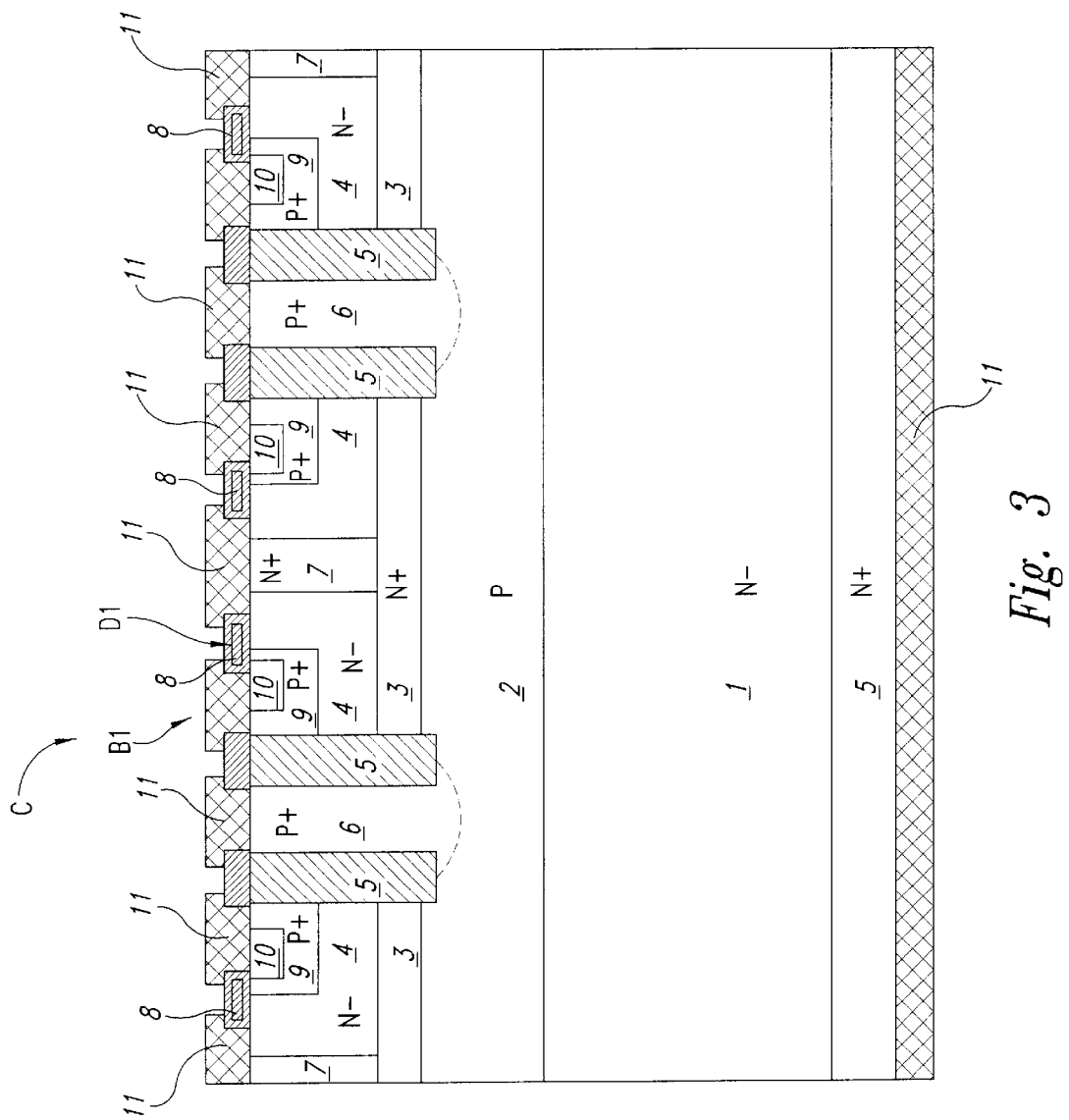
FIG. 3 is an enlarged scale, vertical cross-section view taken along line A—A in FIG. 2.

Shown in FIG. 3 are four cells of the inventive device.

For simplicity, the forming of a single cell C will be described hereinafter.

A first epitaxial layer 1 is grown on a substrate S having a high concentration of N-type dopant.

In particular, the concentration and thickness dimension of layer 1 will depend on the expected voltage range for the device operation.

A first buried region 2 of the P type, and a second region 3 of the N type overlying the first region 2, are formed in this layer 1, preferably by ion implantation followed by a diffusion process.

Such first and second regions will form the deep base and emitter, respectively, of the high-voltage BJT transistor B1.

A second epitaxial layer 4 of the N type is then grown on top of the first epitaxial layer 1.

Over the surface of the second epitaxial layer 4, an isolation structure 5 is formed by conventional photolithography and selective etching which extends from the silicon surface down to and beyond the N-type buried region 3.

Advantageously, the isolation structure 5 is a trench isolation region laid into a cylinder pattern in layer 4 and reaching down to the buried region 2.

Advantageously, the trench isolation region 5 is filled with an insulating material.

A region 6 of the $P^+$ type is formed within the isolation structure 5 by ion implantation, followed by a diffusing step, on the surface of the second epitaxial layer 4. Thus, the region 6 will be bordered by the isolation structure 5 and partly enclosed therein.

This region 6 is essentially a contact region, and is arranged to join the P-type buried regions 2 of the first epitaxial layer 1, so that surface contacts can be obtained for the base region of transistor B1.

Advantageously, the breadth of the diffused region 6 can be quite small, for example smaller than the buried region 3, and its concentration increased by virtue of the isolation structure 5 preventing sideward diffusion of this region.

Advantageously, a deep region 7 of the $N^+$ type is formed in the same manner as region 6, to contact the emitter region 3.

In the layout of FIG. 3, this region 7 appears in the buried region 3 approximately halfway between two isolation structures 5.

This region 7 joins the buried emitter region 3 of the N type to form the surface emitter region of transistor B1.

It would be possible to omit region 7. In this case, with a suitable dopant concentration provided in the region 4, the conductivity of the region 4 of the $N^-$ type can be modulated to reduce it by injecting holes from region 2 and through region 3.

The buried region 3, forming the emitter region of the high-voltage transistor B1, also forms the drain region of the second DMOSFET transistor D1 connected in series with transistor B1.

An insulating layer is then formed selectively to provide the gate oxide layer for transistor D1.

A polycrystalline silicon region 8, constituting the gate electrode of the DMO SFET D1, is formed by conventional deposition and photolithography techniques.

Using conventional photolithography and ion implantation techniques, a first P-type region 9 and a second N-type region are then formed in the monocrystalline silicon surface next to the gate region, to respectively provide body and source regions for the DMOSFET D1.

Advantageously in this invention, the gate electrode of transistor D1 only overlaps the source and drain regions along one side.

The electrical contacts 11 and their associated electrodes are formed in the front surface of the silicon wafer by conventional photolithography and deposition techniques.

Control circuitry can be provided by the same process steps as are used for fabricating the inventive structure.

Figure 4:
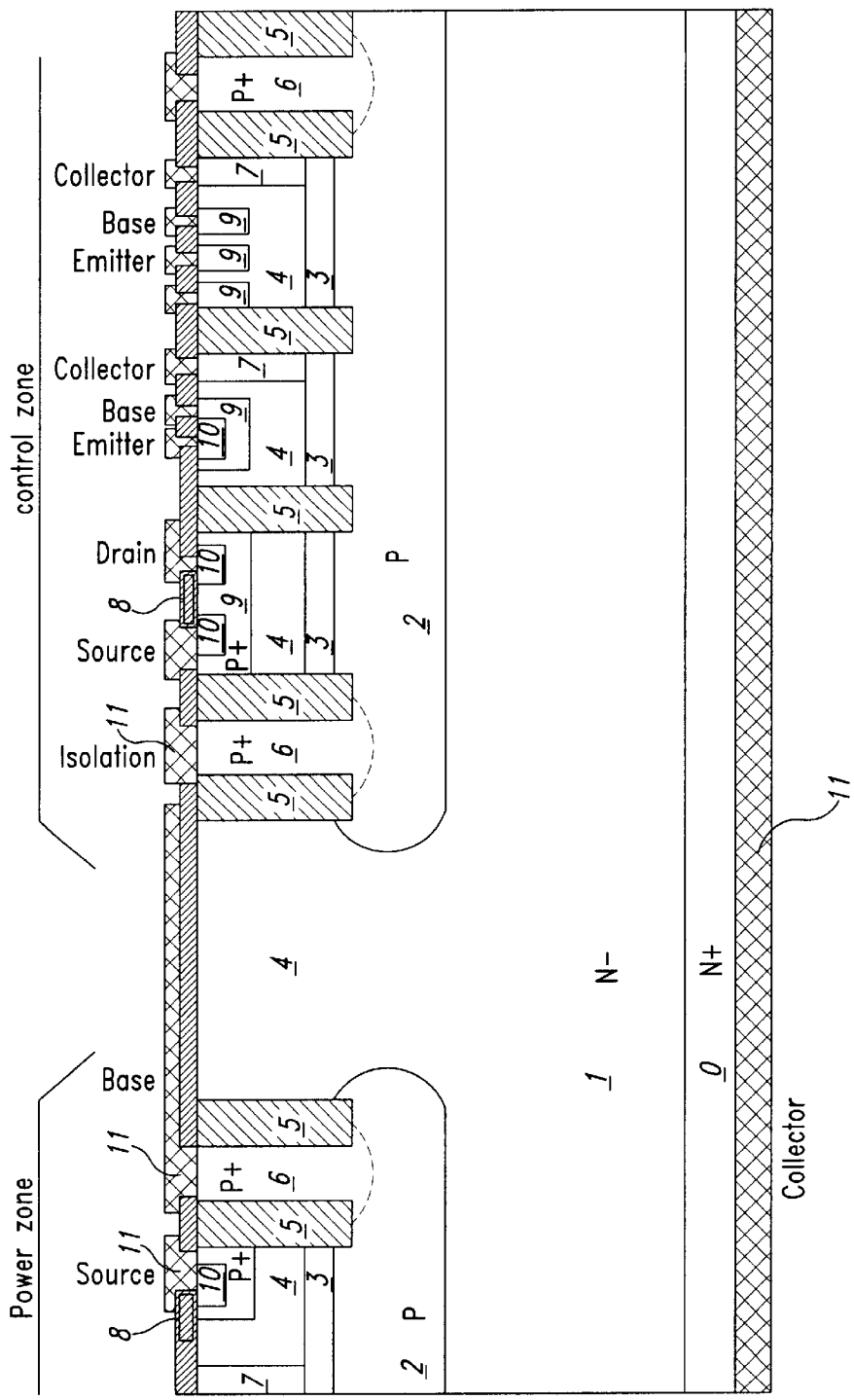
FIG. 4 is a vertical cross-section view, drawn to an enlarged scale, of an embodiment of control circuitry for an emitter switching configuration integrated device of the MOS-bipolar type.

Shown by way of example in FIG. 4 are a MOS transistor M1, bipolar transistor B2, and lateral transistor L1.

In particular, by having the process flow of this invention include a step leading to formation of the structure 5, additional isolation structures 5 can be provided in this semiconductor portion, that is at the control circuitry. In this way, the parameters of the individual components can be set, and the performance of each device optimized without affecting that of an adjacent device.

Also, regions 6 bordered by an isolation structure 5 can be provided peripherally of the control area, as shown in FIG. 4.

This structure is effective to significantly depress the efficiency of a parasitic lateral PNP transistor, occasioned by regions 2, 1, 2 in FIG. 4 and located in the area which separates the power device from control circuitry.

The operation of the parasitic PNP transistor is mainly dependent on peripheral area, and by having the trenches 5 intervene between the two (P+) regions 6, its area can be drastically reduced to no more than the breadth A of region 2.

Advantageously, the presence of a region 7 tends to lower the surface resistance $R_{ON}$ of the MOSFET transistor D1.

The parasitic JFET effect brought about by the regions 9 of any two adjacent cells C, and by the region 4 lying between the two regions 9, is apt to raise the surface resistance of the layer, and this is prevented by the region 7 provided.

Region 7 is also effective to decrease the surface resistance Repi of region 4 by providing a preferential path for the electron flow from the buried emitter region 3, the flow being redirected to the channel region 9a of transistor D1.

Advantageously, the transistor structure of this invention achieves optimum balance of the base-emitter voltage Vbe of the bipolar component. In fact, the drain current of the MOSFET D1 will reach the emitter region at the middle of it, equidistantly from the base contacts 6. Accordingly, the voltage Vbe can be balanced by utilizing the voltage drop across the layer resistance of region 3.

Advantageously, the transistor structure of this invention suppresses the parasitic lateral PNP transistor, formed by regions 6, 4, 9, because the trench 5 isolating the parasitic transistor emitter, which otherwise would drain some of the base current to ground, lowers the static current gain.

Advantageously, the transistor structure of this invention has at most the same area requirements as a discrete power bipolar, because the MOSFET device is formed within the geometry of the emitter finger.

Advantageously, the structure of this invention would occupy a smaller area than conventional cascode structures. This because the region 5 keeps the sideward diffusion of region 6 and, being made of an insulating material, allows the gaps between region 6 and region 3 and/or region 7 to be greatly reduced.

Advantageously, the transistor structure of this invention enables an emitter electrode to be formed from the bipolar transistor region 7 and utilized to sense the voltage of the emitter region 3 from outside the integrated circuit. Furthermore, by providing the emitter surface region 7, an external load can be driven even with the MOS transistor in the "off" state.

The device of this invention can drive two loads simultaneously: a first load at the output end of the series comprising the bipolar and MOS transistors, and the second load at the output end of the bipolar transistor only.

In addition, the device structure according to the invention can be integrated to an integrated power device (PIC) because all of the required process steps for forming it are already provided by the PIC process sequence.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claimed is:

1. An electronic device, integrated monolithically in a semiconductor substrate, comprising: a bipolar transistor connected in series to at least one MOS transistor, the bipolar transistor having a base region which includes a first buried region and a first diffused region extending continuously from the substrate surface to the first buried region, the diffused region formed to be partly enclosed in an isolation trench region extending into the first buried region, and an emitter region comprising a second buried region formed above the first buried region, the isolation trench region formed to extend below the second buried region and into the first buried region to isolate the second buried region from the diffused region.

2. The electronic device of claim 1, wherein the transistor has an emitter region comprised of a second buried region formed over said first buried region, and comprised of a second diffused region extending from the surface down to the buried region.

3. The electronic device of claim 1, wherein said isolation trench region is filled with an insulating material.

4. The electronic device of claim 1, wherein the diffused region is heavily doped.

5. The electronic device of claim 1, wherein said MOS transistor has a drain region contained in the emitter region of the bipolar transistor, said drain region containing a third diffused region having a high dopant concentration and including a source region of the MOS transistor and a gate region that is connected to the associated drain and source regions at one connection point.

6. A monolithically integrated power device, comprising:
a MOSFET transistor and a bipolar power transistor coupled together to form a cascode-type cell, the bipolar power transistor comprising:
a first buried region of a first type conductivity and a second buried region of a second conductivity type formed over the first buried region in a first epitaxial layer;
a second epitaxial layer formed over the first epitaxial layer;
a plurality of isolation trenches formed to extend from the surface of the second epitaxial layer through the second buried region and into the first buried region; and
a plurality of first diffused regions formed to be enclosed by a respective isolation trenches that extend through the second epitaxial layer and the second buried region and into the first buried region to isolate the second buried region from the first diffused regions.

7. The device of claim 6, further comprising a second diffused region extending from the surface of the second epitaxial layer to the second buried region, the second diffused region formed between first and second isolation trenches.

8. The device of claim 6, wherein the first diffused regions each have a breadth that is smaller than a breadth of the second buried region, and the first diffused regions are heavily doped.

9. The device of claim 6, wherein the plurality of isolation trenches are formed of and filled with an insulating material.

10. The device of claim 7, wherein the first buried region and the second buried region comprise a deep base and an emitter, respectively.

11. The device of claim 10, wherein the MOSFET transistor has a drain region contained in the emitter region of the bipolar transistor, the drain region containing a third diffused region having a high dopant concentration and including a source region of the MOSFET transistor and a gate region that is connected to the associated drain and source regions at one connection point only.

12. The device of claim 6, wherein the plurality of isolation trenches are each formed to have a cylindrical configuration.

13. The device of claim 6, wherein the MOSFET transistor comprises a gate electrode formed over the second epitaxial layer to overlap a body region of the first type and a source region of the second type on one side only thereof of the MOSFET transistor.

* * * * *